United States Patent [19]

Eide

[11] Patent Number: 5,313,096
[45] Date of Patent: May 17, 1994

[54] IC CHIP PACKAGE HAVING CHIP ATTACHED TO AND WIRE BONDED WITHIN AN OVERLYING SUBSTRATE

[75] Inventor: Floyd K. Eide, Huntington Beach, Calif.

[73] Assignee: Dense-Pac Microsystems, Inc., Garden Grove, Calif.

[21] Appl. No.: 920,763

[22] Filed: Jul. 29, 1992

Related U.S. Application Data

[62] Division of Ser. No. 851,755, Mar. 16, 1992.

[51] Int. Cl.$^5$ ............................................. H01L 23/02
[52] U.S. Cl. ..................................... 257/686; 257/686; 257/784
[58] Field of Search ............... 257/784, 778, 686, 685, 257/621, 774; 361/393

[56] References Cited

U.S. PATENT DOCUMENTS

| | | | |
|---|---|---|---|
| 3,959,579 | 5/1976 | Johnson | 257/784 |
| 4,379,259 | 4/1983 | Varadi et al. | 324/73 |
| 4,956,694 | 9/1990 | Eide | 357/74 |
| 4,996,587 | 2/1991 | Hinrichsmeyer et al. | 257/686 |
| 5,041,395 | 8/1991 | Steffen | 437/206 |
| 5,086,018 | 2/1992 | Conru et al. | 437/207 |
| 5,107,328 | 4/1992 | Kinsman | 257/784 |
| 5,155,068 | 10/1992 | Tada | 437/211 |

FOREIGN PATENT DOCUMENTS

61-137335  6/1986  Japan .

Primary Examiner—William Mintel
Assistant Examiner—Roy Potter
Attorney, Agent, or Firm—Spensley Horn Jubas & Lubitz

[57] ABSTRACT

An IC chip package includes a chip having an upper active surface thereof bonded to the lower surface of a substrate. A plurality of terminals on the active surface are wire bonded within the outer periphery of the chip by bonding wires extending through a plurality of apertures in a lower layer of the substrate to bonding pads on an upper surface of the lower substrate layer. Metallized strips couple the bonding pads to conductive pads at the outer edges of the lower substrate layer. The substrate includes an upper layer having apertures therein. After wire bonding, the apertures in the upper and lower substrate layers are filled with epoxy which is cured and then ground flush with the upper surface of the upper substrate layer. The chip is then lapped to a desired thickness, following which the chip package is electrically tested at various temperatures. The chip package is programmed by wire bonding a chip enable trace to one of a plurality of optional bonding pads of a bonding option array on the lower substrate layer, following which an aperture within the upper substrate layer which provides access to the bonding option array is filled with epoxy which is then cured and ground flat at the upper surface of the substrate. The chip package may then be assembled together with other chip packages into a stack, with the conductive pads of the substrates being joined by strip soldering to form vertical conductive columns.

19 Claims, 6 Drawing Sheets

IC CHIP PACKAGE HAVING CHIP ATTACHED TO AND WIRE BONDED WITHIN AN OVERLYING SUBSTRATE

This is a division of application Ser. No. 07/851,755 filed on Mar. 16, 1992.

FIELD OF THE INVENTION

The present invention relates to the high density packaging and stacking of integrated circuit chips to achieve, for example, an increased memory capacity in a memory circuit.

DESCRIPTION OF RELATED ART

Known memory circuit systems are provided with several printed circuit boards, each having a plurality of integrated circuit (IC) chips encapsulated within packages mounted on the board. The printed circuit boards are typically arranged in a parallel relationship, with each board being disposed adjacent to and spaced from the other boards. If the chip packages are arranged in a single level on each circuit board, then a relatively large amount of space is required, particularly for large capacity memory systems. Moreover, the space between adjacent printed circuit boards is largely unused.

It has therefore become popular in recent years to arrange the chip packages in stacks so as to increase the density of the IC chips within the space available. U.S. Pat. No. 4,956,694 of Floyd Eide, which issued Sep. 11, 1990 and is assigned to the assignee of the present application, describes arrangements in which leadless chip carriers are stacked in order to greatly increase chip density. Each of the leadless chip carriers encapsulates a chip therein and has side faces provided with conductors extending between top and bottom surfaces of the leadless chip carrier. The data signal input and/or output terminals, power and ground terminals of each encapsulated chip are electrically connected to these conductors on the sides of the leadless chip carriers. The chip carriers are stacked, one above the other, such that the various conductors of the chip carriers are in alignment and are electrically connected to one another. The result is a relatively dense stack of chips wired in parallel. At the same time, each chip is connected to a different set of aligned enable signal conductors so as to be enabled independently of all of the other chips in the stack.

The chip packages or carriers used to accomplish chip stacking can assume various different forms. An example of a chip package or carrier which is externally configurable is described in a copending patent application, Ser. No. 07/552,578 of John Forthun, filed Jul. 13, 1990 and commonly assigned with the present application. The Forthun application describes a chip carrier having a central cavity in which the chip is encapsulated. A carrier terminal provided on the outside of the chip carrier is electrically coupled to a circuit terminal on the chip such that the electrical coupling has a removable external configuration link. The configuration of an electronic circuit formed by the chip can be altered by removing the configuration link to break the electrical connection between the carrier terminal and the circuit terminal on the chip.

While the chip packages or carriers described in the Eide patent and in the Forthun application provide relatively compact chip packaging so that high density chip stacking can be accomplished on a printed circuit board, increased packaging density continues to be a desirable goal. Moreover, it would be desirable to provide additional chip packaging configurations and methods of making such chip packages which provide certain additional advantages not present in the prior art. For example, it would be desirable to be able to lap the chip or die to a desired thickness after being made part of a chip package, and it would be desirable to be able to program the package with a bonding wire after package test. The stacking of pre-tested partially packaged chips would also be a desirable feature.

SUMMARY OF THE INVENTION

In accordance with the invention, a chip package is provided in which the upper active surface of the chip is attached to the bottom of a multilayer substrate comprised of at least a lower layer and an upper layer. Various terminals on the active surface of the chip are wire bonded inwardly through a plurality of apertures in the lower substrate layer to bonding pads on an upper surface of the lower substrate layer. The bonding pads are coupled by metallized strips to conductors arranged along opposite side edges of the substrate for parallel electrical connection when a stack of the chip packages is formed. Because the chip terminals are wire bonded inwardly through apertures in the lower substrate layer, such wire bonding is confined within the outer periphery of the chip so as to confine the wire bonding within the X-Y plane of the three dimensional chip package. In this manner, the size of the chip package is minimized, and a stack of the chip packages can be formed within a very small space to provide a very high chip density.

In a preferred embodiment of a chip package according to the invention, the substrate is comprised of lower and upper layers of relatively thin, generally planar configurations which are joined together during formation of the substrate. The lower substrate layer has opposite apertures extending through the thickness thereof to receive bonding wires coupling the terminals on the upper active surface of the chip to bonding pads on an upper surface of the lower substrate layer. The chip is also of thin, planar configuration. Metallized strips on the upper surface of the lower substrate layer couple the bonding pads to conductive pads at the opposite outer edges of the lower substrate layer. The upper active layer of the chip is attached to the lower surface of the lower substrate layer. The upper substrate layer has three apertures extending through the thickness thereof. Two of the apertures which are adjacent opposite ends of the upper layer overlay and are larger than the apertures in the lower substrate layer. The apertures in the upper and lower substrate layers are filled with epoxy after the wire bonding has been completed. A third aperture in the upper substrate layer provides access to a bonding option array on the upper surface of the lower substrate layer. The bonding option array includes a chip enable trace which is coupled via wire bond to a chip enable terminal on the active surface of the chip at one end of the substrate. By virtue of such access the chip enable trace is wire bonded to a selected one of a plurality of optional bonding pads within the bonding option array to complete connection to a selected input/output pad at the edge of the substrate during testing and programming of the chip assembly. The third aperture in the upper substrate layer is then filled with epoxy which is cured and then ground flat at the upper surface of the upper substrate layer.

In a preferred method of making a chip package according to the invention, the chip and the multilayer substrate are provided as separate elements. The upper active side of the chip is attached to the lower surface of the lower substrate layer with an appropriate adhesive such as epoxy. Next, the terminals on the active surface of the chip are wire bonded to the bonding pads on the upper surface of the lower substrate layer so that the bonding wires pass through the apertures adjacent the opposite ends of the lower substrate layer. The apertures in the lower substrate layer and the corresponding apertures in the upper substrate layer are then filled with epoxy. Following curing of the epoxy, the upper surface of the upper substrate layer is ground to make the epoxy flush with such surface. Next, the lower surface of the chip is lapped as necessary to provide the chip with a desired thickness.

The chip package is then electrically tested at various different temperatures. One or more input/output (I/O) pins can be programmed by virtue of off-chip wire bonding. This is accomplished by wire bonding the chip enable trace to a selected one of the optimal bonding pads in the bonding option array. The position of the chip within a final stack assembly need not be determined until after the tests are performed and the associated yield loss determined. Following testing and programming, the third aperture in the upper substrate layer is filled with epoxy which is cured and then ground flush with the upper surface of the upper substrate layer.

The chip packages are then assembled into a stack. The conductive pads at the opposite edges of the substrate of each package are formed into vertical arrays of conductors in the stack by soldering, wire bonding or other appropriate connection. The result is a stack of partially packaged but fully tested chips. The stack itself can be tested and repaired as necessary. Thereafter, the stack is attached to a lead frame or substrate and encapsulated using transfer molding or other packaging techniques.

The ability to lap the chip in package form after handling in a thick form as part of the assembled chip package is advantageous. Also advantageous is the ability to post-test package programming with bonding wire, and the ability to form a stack of pretested partially packaged chips.

BRIEF DESCRIPTION OF THE DRAWINGS

A detailed description of the invention will be made with reference to the accompanying drawings, in which.

DETAILED DESCRIPTION OF THE PREFERRED EMBODIMENTS

Figure 1:
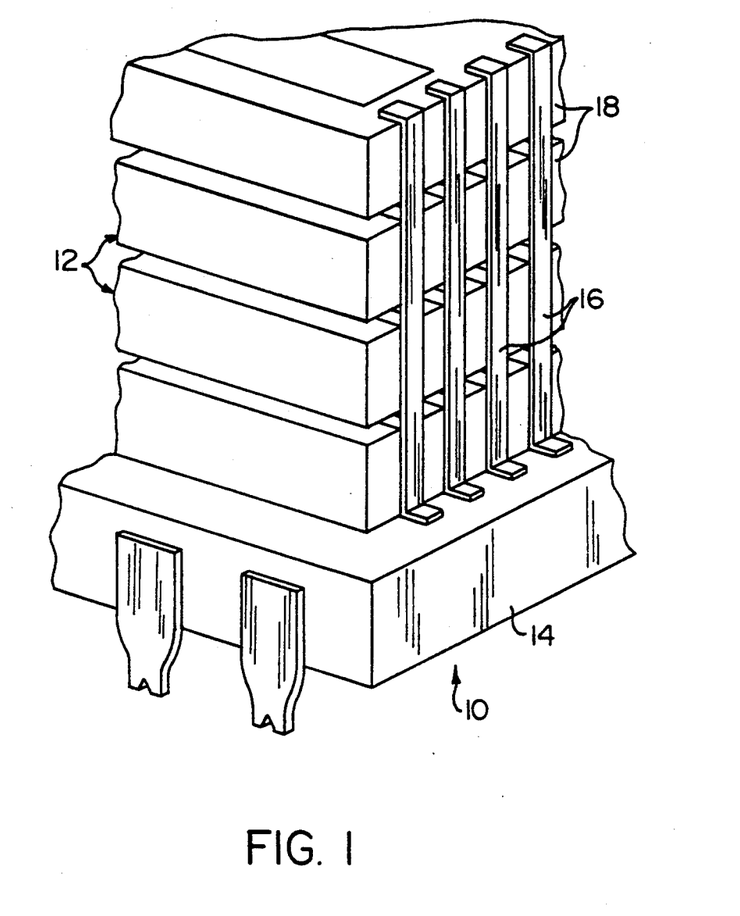
FIG. 1 is a perspective view of a portion of a chip stack employing a plurality of chip packages in accordance with the invention.

FIG. 1 shows a chip stack 10 including a plurality of chip packages 12 in accordance with the invention. Although the chip stack 10 may be comprised of practically any number of the chip packages 12 that is desired, the example of FIG. 1 comprises four of the chip packages 12. The chip packages 12 are stacked in a vertical array on top of a lead frame or substrate 14. Vertical strips of solder 16 extend along side surfaces 18 of the individual chip packages 12 to couple conductive pads on the chip packages 12 in parallel. Such interconnections are shown in greater detail in FIG. 2, to which reference is now made.

Figure 2:
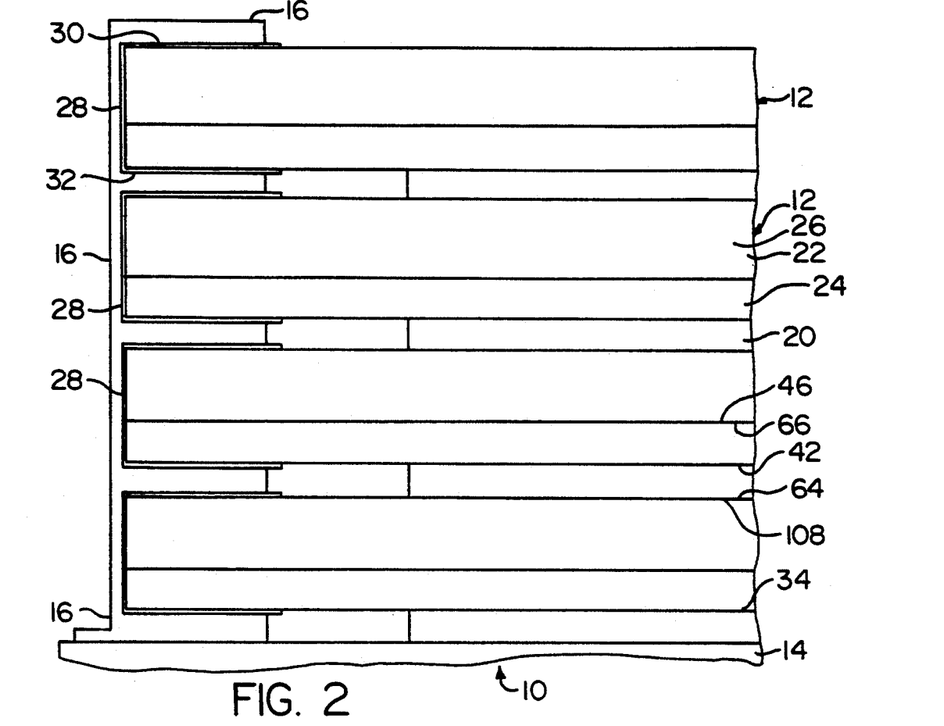
FIG. 2 is a side view of a portion of the chip stack of FIG. 1.

FIG. 2 is a side view of the vertical stack of the chip packages 12 shown in FIG. 1. As shown in FIG. 2, each chip package 12 is comprised of an IC chip or die 20 disposed beneath a substrate 22. The substrate 22 is multilayer in nature and is comprised of a lower substrate layer 24 disposed immediately above and attached to the chip 20, and an upper substrate layer 26 disposed over the lower substrate layer 24. The chip 20 of each chip package 12 is disposed on top of the upper substrate layer 26 of the chip package 12 immediately below.

The lower and upper substrate layers 24 and 26 are separately shown and described herein for clarity of illustration. The layers 24 and 26 are joined together as part of the process of forming the substrate 22, before the chip 20 is attached thereto.

Each chip package 12 has a plurality of conductive films 28 spaced along the side surface 18 thereof. As described hereafter, each conductive film 28 is in electrical contact with a different conductive pad within the substrate 22 of the chip package 12. The conductive film 28 is attached to opposite conductive pads 30 and 32 at upper and lower surfaces respectively of the substrate 22 to form a generally U-shaped electrical contacts during formation of the substrate 22. The solder strips 16 of FIG. 1 contact the conductive film 28 and the opposite conductive pads 30 and 32 of each chip package 12, to form a vertical conductor array, as shown in FIG. 2.

Figure 3:
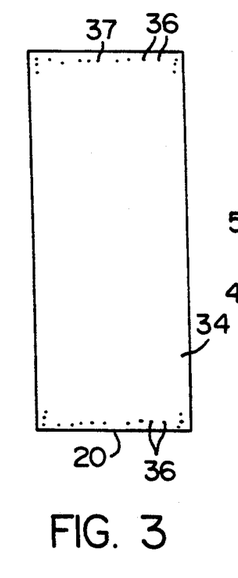
FIG. 3 is a plan view of a chip used in each of the chip packages in the stack of FIGS. 1 and 2.
Figure 4:
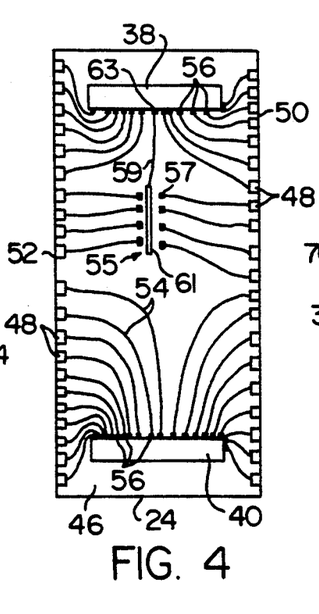
FIG. 4 is a plan view of a lower substrate layer forming a part of a multilayer substrate used in each of the chip packages of the chip stack of FIGS. 1 and 2.
Figure 5:
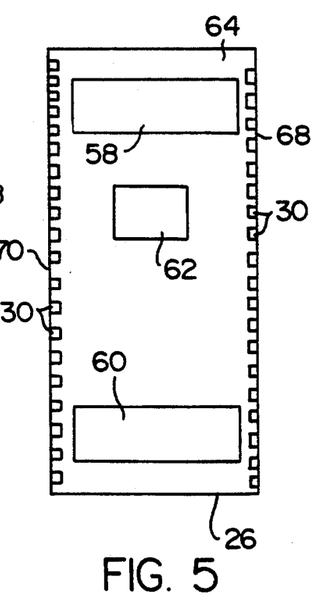
FIG. 5 is a plan view of an upper substrate layer forming another part of the multilayer substrate used in each of the chip packages of the chip stack of FIGS. 1 and 2.

The chip 20, the lower substrate layer 24 and the upper substrate layer 26 of each chip package 12 are shown in FIGS. 3, 4 and 5 respectively. As shown in FIG. 3, the chip 20 is rectangular in shape and of relatively thin, generally planar configuration. An upper active surface 34 of the chip 20 includes a plurality of electrical terminals 36 in conventional fashion. The terminals 36 are concentrated at opposite ends of the chip 20, and include a chip enable terminal 37.

The lower substrate layer 24 is shown in FIG. 4 as being a rectangular element of relatively thin, generally planar configuration as is the upper substrate layer 26 of FIG. 5. The lower and upper substrate layers 24 and 26 are of like length and width, but different in thickness, with the upper substrate layer 26 being thicker than the lower substrate layer 24. The lower substrate layer 24 is slightly longer and wider than the chip 20, so that apertures 38 and 40 adjacent the opposite ends thereof overlie the electrical terminals 36 at the opposite ends of the chip 20 when the active surface 34 of the chip 20 is attached to a lower surface 42 at the underside of the lower substrate layer 24. The lower surface 42 of the lower substrate layer 24 is shown in FIG. 2.

As shown in FIG. 4, the lower substrate layer 24 has an upper surface 46 opposite the lower surface 42 thereof. The upper surface 46 has a plurality of conductive pads 48 mounted thereon along opposite side edges 50 and 52 of the lower substrate layer 24 and forming input/output (I/O) terminals for the chip package 12. The conductive pads 48 make electrical contact with the conductive films 28 on the side edges 18 of the chip packages 12 to couple corresponding ones of the conductive pads 48 within the different chip packages 12 in parallel. The upper surface 46 of the lower substrate layer 24 also includes a plurality of metallized strips 54 which extend from the conductive pads 48 to the edges of the apertures 38 and 40 and to a bonding option array 55 at a central region of the lower substrate layer 24. The metallized strips 54 which extend to the apertures 38 and 40 terminate in bonding pads 56 at the edges of the apertures. The remaining metallized strips 54 terminate at optional bonding pads 57 within the bonding option array 55. A metallized strip 59 which forms a main chip enable trace couples a central terminal 61 within the bonding option array 55 to a chip enable bonding pad 63 at the edge of the aperture 40. The chip enable bonding pad 63 is wire bonded to the chip enable terminal 37 on the chip 20, as described hereafter.

As shown in FIG. 5, the upper substrate layer 26 is provided with opposite apertures 58 and 60 and an intermediate aperture 62. The upper substrate layer 26 has an upper surface 64 shown in FIG. 5 and an opposite lower surface 66 shown in FIG. 2. When the lower and upper substrate layers 24 and 26 are joined during formation of the substrate 22, the apertures 58 and 60 overlay the apertures 38 and 40 in the lower substrate layer 24. At the same time, the intermediate aperture 62 in the upper substrate layer 26 overlays the bonding option array 55 on the lower substrate layer 24.

As also shown in FIG. 5, the various conductive pads 30 are mounted along the upper surface 64 at opposite side edges 68 and 70 of the upper substrate layer 26. The conductive pads 32 shown in FIG. 2 are mounted along the lower surface 42 of the lower substrate layer 24 at the opposite side edges 50 and 52 thereof, in similar fashion. The conductive pads 30 and 32 are joined by the conductive films 28 during formation of the substrate 22.

The lower and upper substrate layers 24 and 26 are separately shown and described herein for clarity of illustration, and are joined together to form the substrate 22 before the chip 20 is attached thereto. In the case of a ceramic substrate 22, the layers 24 and 26 are co-fired together in the same manner as layers in a standard multilayer hybrid substrate.

Figure 6:
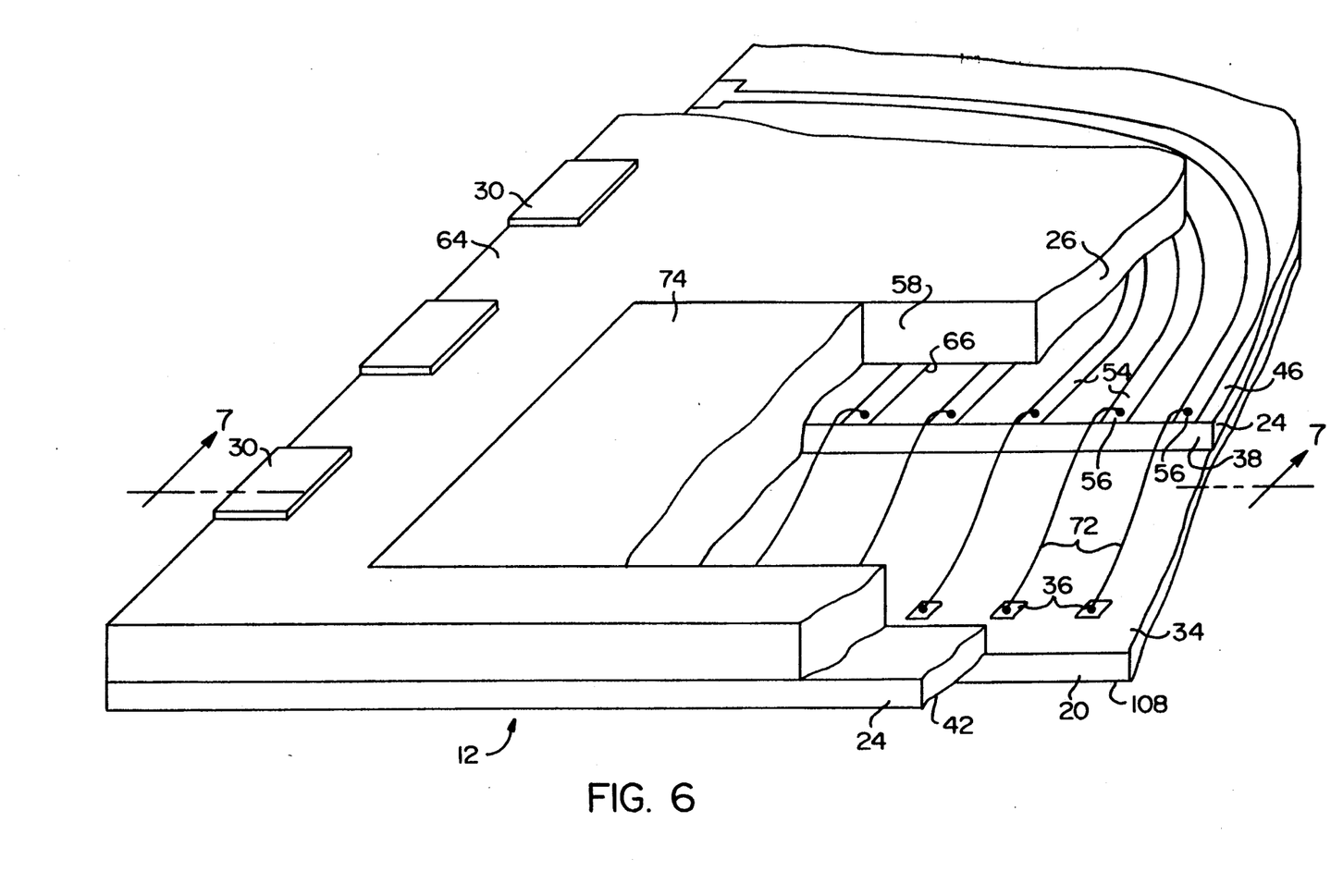
FIG. 6 is a perspective view, partly broken-away, of a portion of one of the chip packages of the chip stack of FIGS. 1 and 2.

FIG. 6 is a perspective, partly broken-away view of the chip package 12. As shown therein, the upper active surface 34 of the chip 20 is attached to the lower surface 42 of the lower substrate layer 24. The terminals 36 on the active surface 34 are exposed by the aperture 38 in the lower substrate layer 24 and the aperture 58 in the upper substrate layer 26. Each terminal 36 on the active surface 34 of the chip 20 is attached by a bonding wire 72 to a bonding-pad 56 at the end of one of the metallized strips 54 on the upper surface 46 of the lower substrate layer 24. Although not shown in FIG. 6, the chip enable terminal 37 is wire bonded to the chip enable bonding pad 63 in similar fashion. The apertures 38 and 58 are filled with a quantity of epoxy 74 which has been ground flush with the upper surface 64 of the upper substrate layer 26. Several of the conductive pads 30 on the upper surface 64 of the upper substrate layer 26 are shown in FIG. 6.

Figure 7:
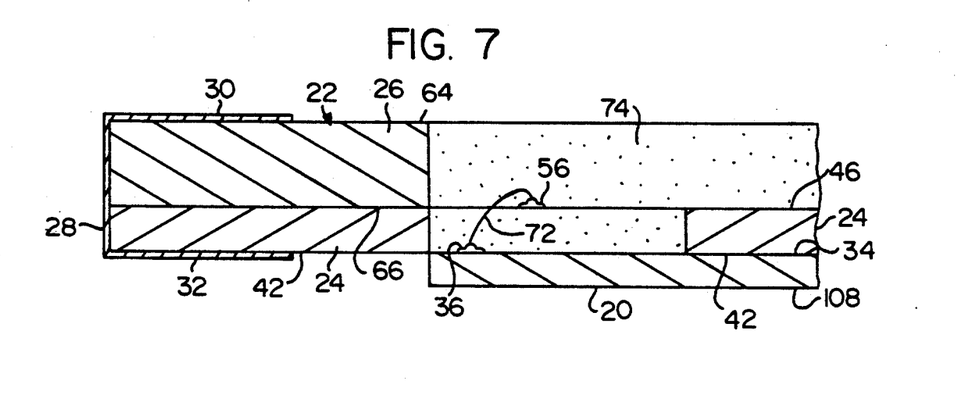
FIG. 7 is a sectional view of the chip package of FIG. 6 taken along the lines 7—7 thereof.

FIG. 7 is a sectional view of the chip package 12 taken along the line 7—7 of FIG. 6. This further illustrates the manner in which each terminal 36 at the upper active surface 34 of the chip 20 is coupled by a bonding wire 72 to a bonding pad 56 at an edge of the aperture 38 in the lower substrate layer 24. The apertures 38 and 58 are filled with the epoxy 74.

Figure 8:
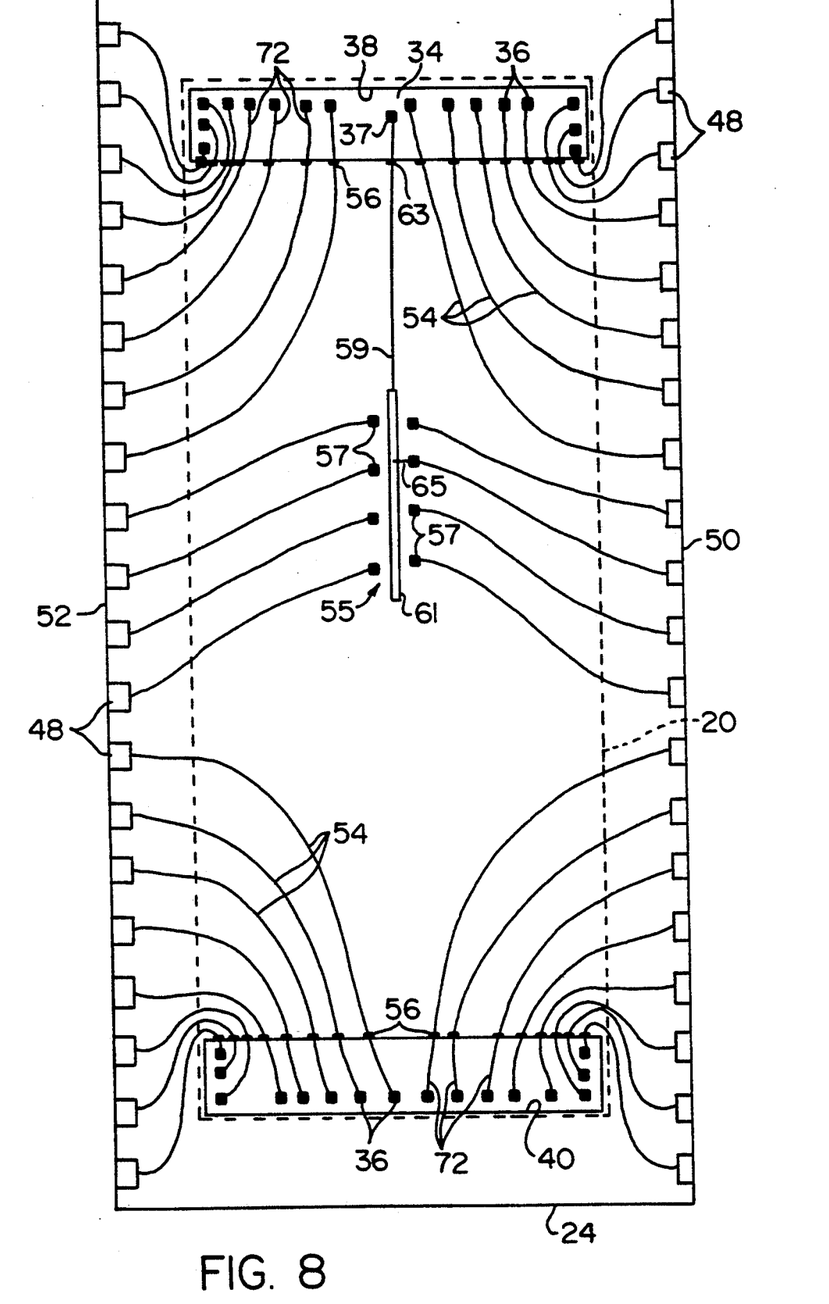
FIG. 8 is an enlarged plan view of the lower substrate layer of FIG. 4 after the chip of FIG. 3 has been attached to the multilayer substrate and wire bonding at the opposite ends has been accomplished.

FIG. 8 is an enlarged plan view of the lower substrate layer 24. The chip 20 which is attached to the lower surface 42 of the lower substrate layer 24 is shown in dotted outline in FIG. 8. FIG. 8 illustrates the manner in which the various terminals 36 on the upper active surface 34 of the chip 20 are coupled through the apertures 38 and 40 to the bonding pads 56 by the bonding wires 72. The bonding pads 56 at the edges of the apertures 38 and 40 are coupled by the metallized strips 54 to the conductive pads 48 at the opposite side edges 50 and 52 of the lower substrate layer 24. One of the bonding wires 72 couples the chip enable terminal 37 to the chip enable bonding pad 63 at the end of the metallized strip 59.

During testing and programming of the chip package 12, the aperture 62 in the upper substrate layer 26 exposes the bonding option array 55 with the optional bonding pads 57 disposed adjacent and on opposite sides of the central terminal 61. During programming, a bonding wire 65 is used to couple a selected one of the optional bonding pads 57 to the central terminal 61, as shown in FIG. 8. Thereafter, the aperture 62 is filled with epoxy which is cured and then ground flat at the upper surface 64 of the upper substrate layer 26.

Figure 9:
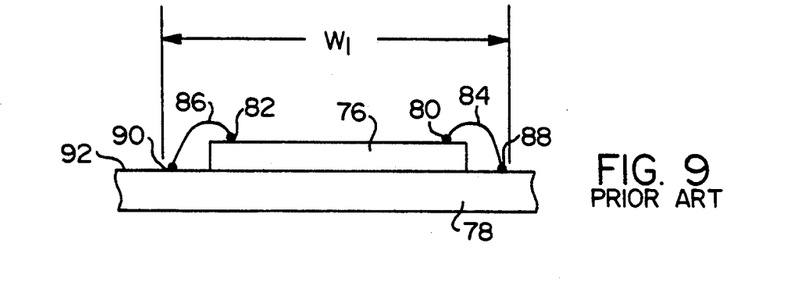
FIG. 9 is a side view of a chip and substrate illustrating a prior art wire bonding arrangement.
Figure 10:
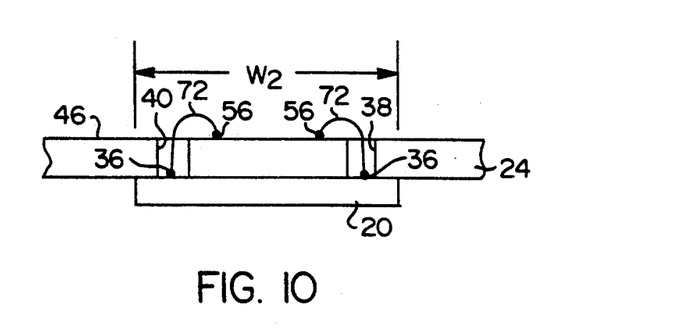
FIG. 10 is a side view of a chip and substrate illustrating inward wire bonding in accordance with the present invention.

The manner in which inward bonding through the apertures 38 and 40 provides for increased chip density in accordance with the invention can be better appreciated with reference to FIGS. 9 and 10. FIG. 9 depicts a typical prior art arrangement in which a chip 76 is mounted on the top of a substrate 78. The chip 76 has terminals 80 and 82 which are coupled by bonding wires 84 and 86 respectively to bonding pads 88 and 90 respectively on an upper surface 92 of the substrate 78. Because of such outward bonding, the width $W_1$ of the lateral space taken up by the chip 76 and the bonding wires 84 and 86 is substantial.

In the case of the present invention, however, as illustrated in FIG. 10, the inward bonding of the electrical terminals 36 of the chip 20 through apertures 38 and 40 to the bonding pads 56 on the upper surface 46 of the lower substrate layer 24 defines a width $W_2$ which is no greater than the width of the chip 20. It is this reduction in the X - Y plane of the chip package 12 that provides for substantially greater chip density within the chip stack 10. The various side edges of the chip 20 lie within planes defining an outer periphery of the chip 20. In arrangements according to the invention, as illustrated in FIG. 10, the bonding wires 72 are confined within such planar outer periphery of the chip 20. Arrangements of the chip packages 12 in accordance with the invention have been found to provide a chip density within the chip stack which is as much as 5-6 times greater than the chip density of the arrangements described in the previously referred to copending application Ser. No. 07/552,578 of Forthun.

Figure 11:
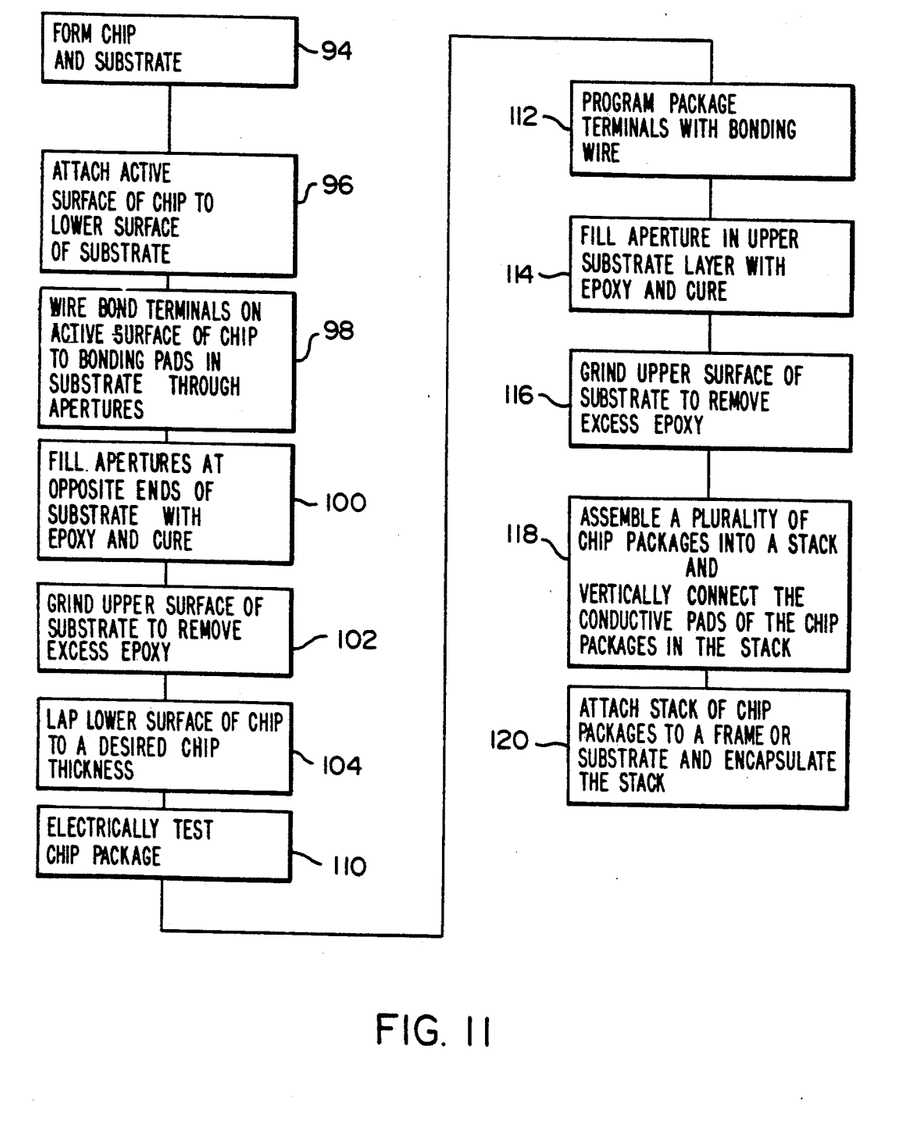
FIG. 11 is a diagram of the successive steps employed in a method of making a chip package and a stack thereof in accordance with the invention.

FIG. 11 shows the successive steps of a preferred method of making the chip stack 10 and the chip packages 12 in accordance with the invention.

In a first step 94 of the method shown in FIG. 11, the chip 20 and the substrate 22 are separately formed. The formed substrate 22 comprises the lower and upper layers 24 and 26 joined together to form the integral substrate.

In a second step 96 shown in FIG. 11, the upper active surface 34 of the chip 20 is attached to the lower surface 42 of the lower substrate layer 24. This is accomplished using epoxy or other appropriate adhesive.

In a third step 98 shown in FIG. 11, the terminals 36 on the upper active surface 34 of the chip 20 are wire bonded to the bonding pads 56 on the upper surface 46 of the lower substrate layer 24 using the bonding wires 72. As previously described, the bonding wires 72 extend through the apertures 38 and 40 in the lower substrate layer 24. At the same time, the chip enable terminal 37 is wire bonded to the chip enable bonding pad 63 through the aperture 38.

In a fourth step 100 shown in FIG. 11, the apertures 38 and 40 in the lower substrate layer 24 and the overlying apertures 58 and 60 in the upper substrate layer 26 are filled with epoxy which is then cured.

Following curing of the epoxy, and in a fifth step 102 shown in FIG. 11, the upper surface 64 of the upper substrate layer 26 is ground to remove excess epoxy. This is accomplished by grinding the surface 64 so that it is flat.

The processing as described thus far allows the chip package 12 to be formed with the chip 20 attached thereto in a relatively thick form. In accordance with a sixth step 104 of the method shown in FIG. 11, a lower surface 108 of the chip 20 opposite the upper active surface 34 thereof is lapped to provide the chip 20 with a desired thickness. In the present example, described in detail herein for purposes of illustration only, the chip 20 is lapped to a thickness of 0.005 inches. The substrate 22 has a thickness of approximately 0.021 inches. This results in the chip package 12 having a total thickness of less than 0.030 inches. The chip 20 of the present example has a length of approximately 0.550 inches and a width of approximately 0.225 inches. The substrate 22 has a length of approximately 0.650 inches and a width of approximately 0.300 inches.

In a seventh step 110 of the method shown in FIG. 11, the chip package 12 as so produced is electrically tested. Testing is carried out at various different temperatures, and determines whether the chip package 12 is acceptable or whether it should be rejected. The testing also determines the operating speed of the chip package 12 and other factors such as whether it should be classified as high power or low power. Later, when a chip stack is formed, chip packages with similar operating speed characteristics are assembled together.

In an eighth step 112 shown in FIG. 11, the chip package is programmed by connecting a length of bonding wire, such as the bonding wire 65 shown in FIG. 8, between the central terminal 61 and a desired one of the optional bonding pads 57 within the bonding option array 55. The aperture 62 in the control region of the upper layer 26 of the substrate 22 provides the necessary access. This has the effect of coupling the chip enable terminal 37 to a desired I/O terminal in the form of one of the conductive pads 48 on the upper surface 46 of the lower substrate layer 24.

In a ninth step 114 shown in FIG. 11, the aperture 62 in the upper substrate layer 26 is filled with epoxy and cured.

In a tenth step 116 shown in FIG. 11, the upper surface 64 of the upper substrate layer 26 is ground to remove excess epoxy and make the surface 64 flat.

In an eleventh step 118 shown in FIG. 11, a stack of the chip packages 12 is assembled to form the chip stack 10. The electrical terminals formed by the conductive film 28 together with the conductive pads 30 and 32 at the opposite edges of the substrate 22 of each chip package 12 are vertically connected by soldering to form the solder strips 16 shown in FIG. 1.

In a final step 120 shown in FIG. 11, the stack of chip packages 12 is secured to the lead frame 14. The stack of chip packages 12 is thereafter encapsulated using transfer molding or other conventional packaging techniques to form the completed chip stack 10.

It will be appreciated by those skilled in the art that apparatus and methods in accordance with the present invention provide a number of important advantages. As previously described, mounting of the chip at the underside of the substrate and then wire bonding inwardly through apertures in the lower substrate layer provides a chip package of compact size and a chip stack having very high chip density. It is also advantageous to be able to mount the chip on the substrate and thereafter process the chip package with the chip in a relatively thick and durable form. Only after the chip package is formed is the chip lapped to its final thickness. The chip assembly may be tested by coupling the main enable trace to a bonding pad at one of the outer edges of the substrate to determine the speed and other characteristics of the assembly. In this manner, chip assemblies with similar speed characteristics can be assembled into the same stack. Programming may then take place, with the main chip enable trace being wire bonded to a desired one of the optional bonding pads. This is advantageously done with the chip already encapsulated within the chip package and thereby protected. A stack of the pretested and partially packaged chips is then formed, with the stack being attached to a frame and encapsulated. The stack can be later disassembled to replace a faulty chip.

The presently disclosed embodiments are to be considered in all respects illustrative and not restrictive. The scope of the invention is indicated by the appendant claims, rather than the foregoing description. All changes which come within the meaning and range of equivalency of the claims are intended to be embraced therein.

What is claimed is:

1. A chip package comprising the combination of:
   a chip having a plurality of terminals on an active surface thereof;
   a lower substrate layer having opposite upper and lower surfaces and at least one aperture extending between the upper and lower surfaces and a plurality of bonding pads on the upper surface, the lower surface of the lower substrate being coupled to the active surface of the chip;

a plurality of bonding wires, each extending through the at least one aperture in the lower substrate layer and coupling one of the plurality of terminals on the active surface of the chip to one of the plurality of bonding pads on the upper surface of the lower substrate layer; and an upper substrate layer disposed on the upper surface of the lower substrate layer, the upper substrate layer having at least one aperture therein communicating with the at least one aperture in the lower substrate layer.

2. A chip package in accordance with claim 1, wherein the at least one aperture in the upper substrate layer and the at least one aperture in the lower substrate layer are filled with epoxy.

3. A chip package in accordance with claim 1, wherein the lower substrate layer has a plurality of conductive pads on an outer periphery of the upper surface thereof coupled to the plurality of bonding pads on the upper surface by metallized strips.

4. A chip package in accordance with claim 3, wherein the lower substrate layer and the upper substrate layer together define a plurality of outer edges of the chip package, and further including a plurality of conductive elements mounted on at least one of the plurality of outer edges of the chip package and coupled to the plurality of conductive pads on the lower substrate layer.

5. A chip package in accordance with claim 1, wherein the plurality of terminals on the active surface of the chip are divided into first and second groups of terminals adjacent opposite ends of the chip, the lower substrate layer has two apertures therein disposed over the first and second groups of terminals respectively on the chip, and the plurality of bonding pads on the upper surface of the lower substrate layer are divided into first and second groups of bonding pads adjacent the first and second apertures respectively in the lower substrate layer.

6. A chip package in accordance with claim 5, wherein the upper substrate layer has first and second apertures therein disposed over and larger in size than the first and second apertures respectively in the lower substrate layer.

7. A chip package in accordance with claim 6, wherein the upper substrate layer has a relatively flat upper surface and the first and second apertures in the lower substrate layer and the first and second apertures in the upper substrate layer are filled with epoxy which is ground flat and continuous with the upper surface of the upper substrate layer.

8. A chip package in accordance with claim 1, further including a bonding option array disposed on the upper surface of the lower substrate layer and including a central terminal coupled to one of the plurality of bonding pads, a plurality of optional bonding pads and a bonding wire coupling the central terminal to one of the plurality of optional bonding pads.

9. A chip package in accordance with claim 8, wherein the upper substrate layer has an aperture therein disposed over the bonding option array.

10. A chip package in accordance with claim 9, wherein the upper substrate layer has a relatively flat upper surface and the aperture in the upper substrate layer is filled with epoxy which is ground flat and continuous with the upper surface of the upper substrate layer.

11. A stack of chip packages comprising the combination of:

a base;

a stack of chip packages mounted on the base and each of the chip packages having a plurality of conductors at an outer periphery thereof coupled to a plurality of conductors on the other chip packages by a plurality of vertical conductors; and each of the chip packages comprising a chip of relatively thin, generally planar configuration bonded to an underside of a substrate of generally planar configuration and having a plurality of electrical terminals wire bonded within the chip package to a plurality of electrical terminals within the substrate, the chip of at least some of the chip packages having a surface coupled to a surface of the substrate of an adjacent chip package.

12. A stack of chip packages in accordance with claim 11, wherein each chip package includes a lower substrate layer bonded to the chip and having the plurality of electrical terminals on an upper surface thereof adjacent at least one aperture therein, and the plurality of electrical terminals on the chip are bonded to the plurality of electrical terminals on the upper surface of the lower substrate layer by bonding wires extending through the at least one aperture in the lower substrate layer.

13. A chip package comprising the combination of:

a chip having a plurality of terminals on a surface thereof;

a substrate having opposite first and second surfaces, an aperture therein extending between the first and second surfaces, and a plurality of terminals disposed within the aperture, the second surface of the substrate being coupled to the surface of the chip so that the plurality of terminals on the surface of the chip are disposed within the aperture in the substrate;

a plurality of bonding wires disposed within the aperture in the substrate and coupling the plurality of terminals disposed within the aperture to the plurality of terminals on the surface of the chip; and filling material disposed within and filling the aperture in the substrate.

14. A chip package in accordance with claim 13, further including a plurality of conductors disposed within the substrate and coupling the plurality of terminals disposed within the aperture to an external surface of the substrate.

15. A chip package in accordance with claim 13, wherein the aperture has a surface generally parallel to the first and second surfaces of the substrate on which the plurality of terminals disposed within the aperture are mounted.

16. A chip package in accordance with claim 13, wherein the first surface of the substrate is relatively flat and the filling material comprises epoxy which has a flat upper surface generally continuous with the first surface of the substrate.

17. A chip package in accordance with claim 13, wherein the substrate has a second aperture extending into the substrate from the first surface thereof, and further including a bonding option array of conductors mounted within the aperture, a bonding wire disposed within the second aperture and coupling selected conductors of the bonding option array, and filling material disposed within and filling the second aperture in the substrate.

18. A chip package in accordance with claim 13, wherein the substrate is comprised of a first layer of thin, planar configuration having opposite first and second surfaces, with the second surface thereof defining the second surface of the substrate, and an aperture extending between the opposite first and second surfaces thereof and forming a part of the aperture of the substrate, the plurality of terminals disposed within the aperture of the substrate being mounted on the first surface of the first layer, a plurality of conductors mounted on the first surface of the first layer and extending between the plurality of terminals and an external surface of the substrate, and a second layer of thin, planar configuration having opposite first and second surfaces, with the first surface thereof defining the first surface of the substrate and the second surface thereof coupled to the first surface of the first layer, the second layer having an aperture extending between the opposite first and second surfaces thereof and forming a part of the aperture of the substrate.

19. A chip package in accordance with claim 18, wherein the second layer has a second aperture extending between the opposite first and second surfaces thereof, and spaced apart from the first-mentioned aperture in the second layer, and further including a bonding option array of conductors mounted on the first surface of the first layer within the second aperture in the second layer, a bonding wire disposed within the second aperture in the second layer and coupling selected conductors of the bonding option array, and filler material disposed within and filling the second aperture in the second layer.

* * * * *